United States Patent
Deix et al.

(10) Patent No.: US 6,256,761 B1
(45) Date of Patent: Jul. 3, 2001

(54) INTEGRATED ELECTRONIC MODULE WITH HARDWARE ERROR INFEED FOR CHECKING PURPOSES

(75) Inventors: Johann Deix, Lanzendorf (DE); Majid Ghameshlu, Vienna (AT); Karlheinz Krause, Planneg (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/133,925

(22) Filed: Aug. 13, 1998

(30) Foreign Application Priority Data

Aug. 13, 1997 (DE) .............................. 197 35 163

(51) Int. Cl.$^7$ .................................. G01R 31/28
(52) U.S. Cl. ........................................... 714/727
(58) Field of Search ................... 714/726, 727, 714/741, 720, 729, 718

(56) References Cited

U.S. PATENT DOCUMENTS

| | | | |
|---|---|---|---|
| 5,130,988 | 7/1992 | Wilcox et al. | 714/726 |
| 5,377,198 | * 12/1994 | Simpson et al. | 714/726 |
| 5,423,050 | * 6/1995 | Taylor et al. | 395/575 |
| 5,428,624 | * 9/1997 | Blair et al. | 714/720 |
| 5,515,384 | 5/1996 | Horton, III | 714/732 |
| 5,553,249 | * 9/1996 | Datwyler et al. | 395/308 |
| 5,668,816 | * 9/1997 | Douskey et al. | 714/727 |
| 5,938,779 | * 8/1999 | Preston | 714/718 |
| 6,108,807 | * 8/2000 | Ke | 714/726 |

FOREIGN PATENT DOCUMENTS

| | | |
|---|---|---|
| 2 329 610 | 1/1974 | (DE) . |
| 26 10 761 | 9/1977 | (DE) . |
| 41 10 896 A1 | 10/1991 | (DE) . |

OTHER PUBLICATIONS

Abdollah et al., Functional Fault Simulation of VHDL Gate Level Models, IEEE, pp. 18–23, 1997.*

Brglez et al., A Modular Scan –Based Testability System, IEEE, pp. 408–412, 1988.*

* cited by examiner

*Primary Examiner*—Albert Decady
*Assistant Examiner*—Shelly A Chase
(74) *Attorney, Agent, or Firm*—Bell, Boyd & Lloyd LLC

(57) ABSTRACT

An integrated electronic module which is equipped with at least one hardware error infeed for testing purposes and which includes a number of terminals whereby the error infeed is controlled with a control logic. The control logic includes at least one terminal as data input for command signals at the control logic as well as an error control output which is connected to a signal input of the error infeed. The control logic decodes the command signals entered via the data input, derives commands for error control therefrom and gives signals to the error control output corresponding to these commands. The control logic may be constructed as part of a boundary scan test logic of the module.

4 Claims, 2 Drawing Sheets

INTEGRATED ELECTRONIC MODULE WITH HARDWARE ERROR INFEED FOR CHECKING PURPOSES

BACKGROUND OF THE INVENTION

1. Field of the Invention

The present invention relates to an integrated electronic module which is equipped with at least one hardware error infeed for checking purposes as well as a number of terminals. The present invention also relates to a method for simulating hardware errors on an integrated electronic module which is equipped with at least one hardware error infeed for testing purposes.

2. Description of the Prior Art

For purposes of testing electronic devices, particularly by customers when purchasing from a manufacturer, hardware errors are simulated and the corresponding correct response of the device, among other things, is thereby checked. Interruptions of lines or plug contacts, shorts, inversions, etc., are, therefore, simulated. The test is usually directed to whether and to what extent such an error can be reliably detected, localized, traced to its possible cause and, finally, reported in the device. The simulation of hardware errors in integrated electronic modules (ICs), particularly application-oriented integrated modules (ASICs), turns out to be difficult, if not impossible, to the extent that the internal components and lines of an IC are shut off from direct access.

Until now, error infeeds have been realized through intermediate adapters, switches, jumpers, special assemblies, extra busses and various other methods. A functional hardware error—e.g., inversion of the data or addresses, generation of an interrupt and other similar errors—has been fed in through adjustment of the switch, insertion of the special assembly, and so on. The methods utilized until now presuppose a one-time, expensive development, documentation, production and test of the required equipment, which is utilized only for purchase in the presence of the customer. Furthermore, these methods are not uniform and not standardized. In commissioning, this demands repeated and precise studying by the personnel of the methods applied in each individual system. Also, either one has to be satisfied with generating a relatively low number of errors "by hand" or one has to create a separate means for controlling the error generation which, above all else, results in additional hardware outlay.

It is thus an object of the present invention to develop a hardware error infeed that can be executed both simply and uniformly for different types of ICs and that can keep the required outlay for additional hardware components relatively low.

SUMMARY OF THE INVENTION

This object is achieved in an integrated electronic module of the abovementioned type by means of a module in which the control logic includes at least one terminal as data input for the entering of command signals—this terminal being led out of the module—as well as one error control output connected to a signal input of the error infeed(s). The control logic is arranged to decode the command signals entered via the data input, to derive commands for error control therefrom and to apply error control signals at the at least one error control output corresponding to these commands.

This solution allows a flexible response to hardware errors via the error control logic. The number of terminals reserved for the hardware error infeed can be kept to a limited few, e.g. less than five, even if a large number of hardware error simulations are to be implemented. Furthermore, assemblies which previously had to be attached may now be omitted.

One embodiment of the present invention includes at least one terminal for a clock input of the error control logic. This offers an advantage in that the control logic can be operated independent of the operating function of the integrated module and its temporal sequences.

It is particularly advantageous for the present invention, particularly with reference to the module terminals, if the control logic is constructed as part of a boundary scan test logic of the module, the data input is constructed as test data input of a test interface of the boundary scan test logic, and a command register decoder of the boundary scan test logic is arranged to detect commands for error control and to apply error control signals at the at least one error control output corresponding to these commands. Indeed, this also lowers the hardware outlay requirements.

It is also favorable, in order to be able to actuate a greater number of errors or error combinations in simple fashion, if an error address register is provided in the control logic for selecting one or more error control outputs from a total number of error control outputs.

The present invention further encompasses a method of the abovementioned type by means of a method in which command signals are transmitted to a control logic provided in the module via a data input that is led out of the module, the command signals are decoded in the control logic wherein commands for error control are derived therefrom, and the at least one error infeed is controlled according to these error control commands. It is therein advantageous, e.g. in the simultaneous simulation of a plurality of hardware errors, if different commands are respectively given for the activation and deactivation of the error infeed(s).

In a preferred embodiment of the present invention, which further simplifies the execution of the error simulation, the transmission of the command signals occurs via the test data input of a test interface of the boundary scan test logic, and the decoding of the command signals occurs in a command register decoder of the boundary scan test logic. It is therefore favorable—e.g., in order to control a great number of errors or error combinations in simple fashion—if an error address register is loaded with an error address consequent to a corresponding error control command, and a number of error infeeds are selected and controlled on the basis of this error address in consideration of the initiating error control command.

Additional features and advantages of the present invention are described in, and will be apparent from, the Detailed Description of the Preferred Embodiments and the Drawings.

DETAILED DESCRIPTION OF THE PREFERRED EMBODIMENTS

Figure 1:
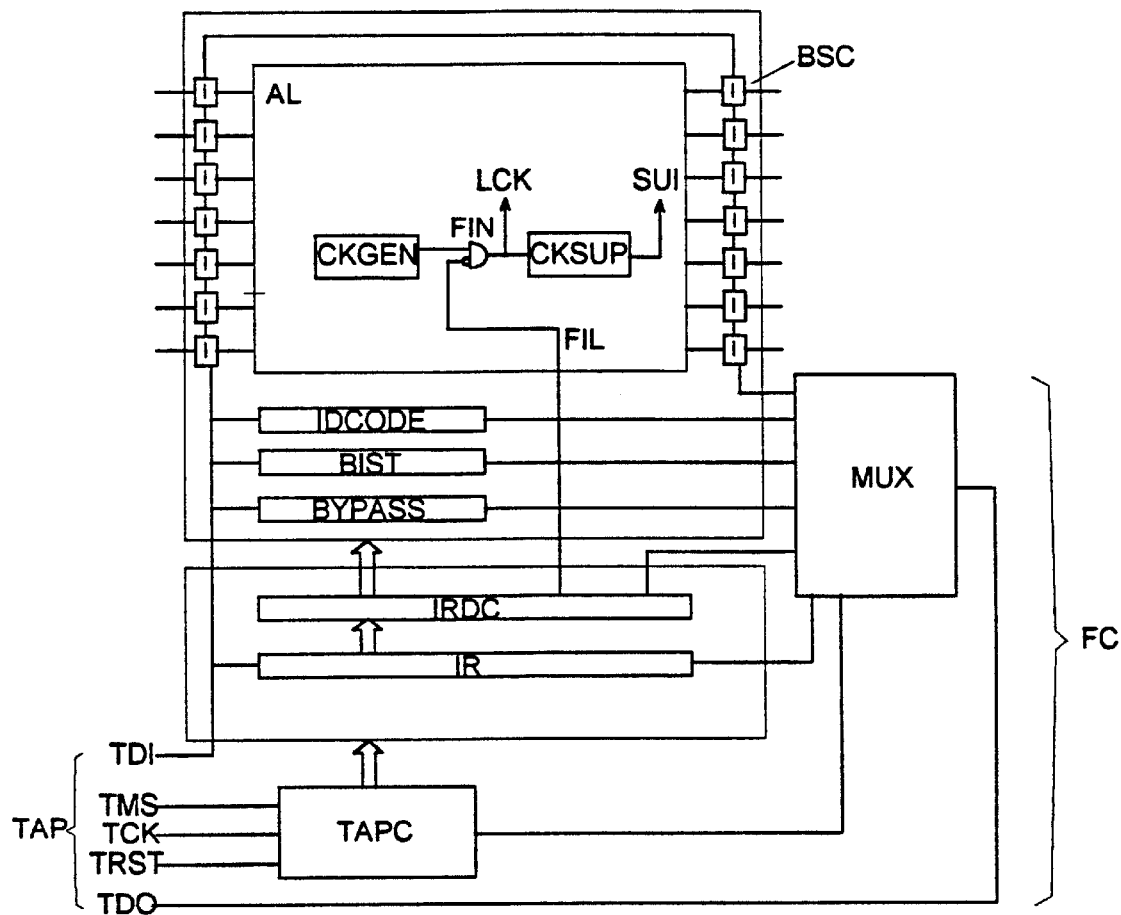
FIG. 1 shows the architecture of an IC with an error infeed via the boundary scan test logic wherein a hardware error in the form of an interruption of a system clock is simulated.

FIG. 1 depicts the simulation of a line interruption which relates to a system clock created in the IC. The system clock is created in a clock generator CKGEN and is conducted by this to the clock-dependent components of the application logic AL of the IC via the system clock line LCK. Since these components are no longer required for the present invention, they are not depicted in FIG. 1. The system clock is checked by a clock supervision CKSUP which responds upon delay or failure of clock pulses and which triggers an error signal via an interrupt line SUI. The further treatment of this error signal depends on the remaining circuit architecture and does not constitute subject matter of the present invention. For purposes of illustration, it is assumed that an interrupt for error treatment is released on another module, for example, and the simulation of the hardware error of the clock supply serves the purpose of checking both the correct running and the message output of this interrupt.

The simulation of an interruption of the system clock occurs with the aid of an error infeed FIN which is constructed as a logical AND gate through which the system clock line LCK runs via the first input and the output of the gate. The second input of the AND gate is inverted and serves as signal input of the error control. In normal operation, the gate allows the system clock to pass without hindrance wherein a logical 0-signal is applied at the signal input. In contrast, for the error simulation, the signal input is applied at a logical 1 so that the AND gate FIN blocks the clock signal. In previous solutions, the signal input of the error infeed FIN was directly or indirectly led out as an error control line FIL, e.g. via a voltage splitter with a jumper, and thus required at least one terminal pin of the IC. For the feeding-in of a plurality of hardware errors, a corresponding plurality of terminals of the IC would have to be reserved.

The present invention provides for the feeding-in of hardware errors via the boundary scan test logic. The boundary scan serves as standardized test logic for the modular and assembly test wherein such logic is integrated in the module. It is based on the IEEE standard 1149-1 which is described in detail, for example, in the book "Boundary Scan Test: A Practical Approach," H. Bleeker, P. van den Eijnden and F. de Jong, Dordrecht, Boston, Kluwer Academic Publishers 1993, ISBN 0-7923-9296-5. The primary goals of the boundary scan are the test of the connections between the ICs, the observation of signals at the IC terminals during the normal operational function, and the controlling of the self-test of an IC. In currently available ICs, and particularly in ASICs, the boundary scan is typically already implemented. This embodiment thus makes do without the cited additional outlays in hardware such as switches or jumpers.

The IEEE standard 1149-1 provides a TAP ("Test Access Port") which is a serial interface for the boundary scan. This serves testing purposes exclusively and includes four terminals TDI, TMS, TCK and TDO as well as an optional reset input TRST. Via the TAP, the TAP controller TAPC (an automatic status device with 16 statuses) is controlled, commands are serially shifted into a command register IR, and testing and identification data are shifted in or, respectively, out. The test clock TCK and the controller input TMS serve to control the TAP controller TAPC, while the test data input TDI and output TDO are provided for shifting data and commands for the command register in and out.

For the detection of the commands that arrived via the test data input TDI, the command register IR includes a decoder IRDC. The actual tests are conducted pursuant to these commands. Depending on the command length (usually 4 bits, but sometimes more) a defined number of commands are available; namely, $2^4=16$ or, respectively, more. The test logic is designed such that it is operated substantially independently of the application logic of the circuit. The shifting of the serial commands to the TAP interface for the execution of the boundary scan test proceeds from a boundary scan test device which can be a correspondingly equipped PC, for example.

The boundary scan architecture further contains a shift register that can be loaded in parallel fashion and which has individual memory cells BSC inserted into what are known as boundary scan cells between the IC terminals and the application logic AL. Although this shift register, which represents a central component of the boundary scan in itself, could be utilized for the error simulation on the side of the input and output terminals of the IC, this is not critical to the present invention, which does not include the wiring of the inputs and outputs. The bypass register BYPASS, which is a single-stage shift register, is another register of the boundary scan which is utilized to shift TAP commands through the IC to another IC, for example. The bypass register enables the curtailing of the shift chain of the IC to one stage in such cases; the test output TDO being used for shifting these commands out. The registers IDCODE and BIST of the boundary scan are not critical to the present invention, as are the multiplexer/drive MUX on the side of the test data output TDO.

A defined number of the command combinations in the command register IR is reserved for the boundary scan test as well as appertaining tests such as the IC self-test. The commands not used for the boundary scan are available for expansions. Some of these expanded commands are inventively used to influence or falsify the function of the IC. In the example depicted in FIG. 1, the command register-decoder IRDC is to be expanded solely by an additional error control output FIL that is connected to the signal input of the error infeed; i.e., to the inverted input of the AND gate. The error control output FIL is activated consequent to a defined expanded command. The expanded command of this example thus functions as error control command for interrupting the system clock LCK. Thus, error infeed can either occur as long as this error control command is still active or, following one-time activation through the command, occur until the infeed is deactivated again by another error control command.

A significant advantage of this solution is that one can have recourse to present ASICs, etc., which do not require additional terminals. The ICs or, respectively, the assemblies containing the ICs, do not require their own devices such as jumpers in order to simulate the errors. This proves to be very advantageous in practice for the customer. The boundary scan test device is further utilized for shifting the error control commands into the boundary scan test logic, whereby only minor modifications need to be executed in the software of the test device; namely, the programming of the error control commands as expanded commands of the boundary scan.

The present invention utilizes the boundary scan feature of being operable independently and parallel to the normal module functionality. This can be attributed particularly to the independent test clock TCK which enables the boundary scan logic to give commands for the error infeed entirely independently of the normal operational function of an IC.

Besides the interruption of a signal depicted in the example above, other possibilities of hardware error infeed are falsification of data, parities or addresses, artificial creation of a hardware or software interrupt, etc.

Figure 2:
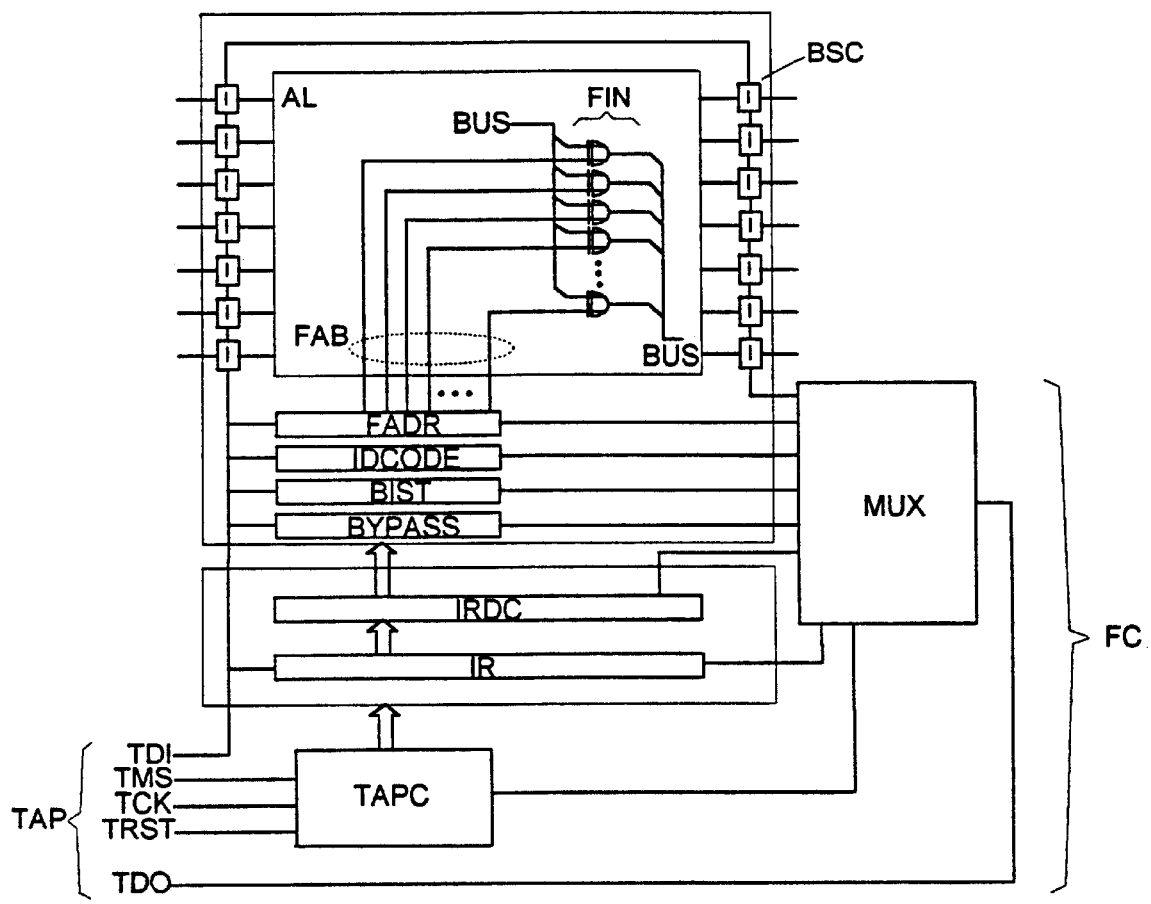
FIG. 2 shows a variation of FIG. 1 wherein hardware errors can be fed in for a plurality of data lines.

An expanded possibility provides a separate register in which the type of the error simulation is stored. For example, a 16-bit shift register FADR is provided in FIG. 2 which serves as an error address register and does not itself belong to the application logic AL. Rather, it is connected in parallel to the registers BYPASS and INCODE and it is supplied with data like these. A decoder is further allocated to the error address register FADR which can distinguish up to $2^{16}$ individual commands corresponding to the bit number of the register FADR. As such, $2^{16}$ error-generating gates or, more generally, $2^{16}$ combinations of errors could be theoretically actuated. Of course the number of bits 16 for the register FADR is only an example. The actual register length conforms to the requirements of the desired hardware error simulation. FIG. 2 depicts an error address bus FAB which includes a number of error control outputs with which a selected record of data lines of a data bus BUS can be interrupted or falsified. Of course, the examples of FIGS. 1 and 2 are not mutually exclusive. An error control command can prompt the direct feeding-in of an error via an error control output according to the type in FIG. 1 while another error control command serves to initiate a transmission of a command to the error address register FADR.

In a variation (not depicted) of the example depicted in FIG. 2, another 16-bit register is provided within the application logic; e.g., a processor controlled ASIC parallel to the external register FADR. The external error address register FADR is controlled by the test clock TCK and, in contrast, the system clock LCK is utilized for readout for the internal error address register. In this case, the processor of the application logic AL can access this internal register, which is useful when complicated errors are generated and the processor needs to access multiple times, for example. An example for this is an application in the processing of cells of the asynchronous transfer mode (ATM) and in the packing of the error simulation into a frame through disturbance of a frame password. The wrong password can also be filed in the register therein; the tested detection of this disturbance occurring through another unit of the same ASIC or through another assembly.

Of course the exemplifying embodiments above do not represent the sole possibilities for realizing the present invention. In particular, the error control is not limited to the utilization of the boundary scan test logic.

Although the present invention has been described with reference to specific embodiments, those of skill in the art will recognize that changes may be made thereto without departing fro the spirit and scope of the invention as set forth in the hereafter appended claims.

We claim as our invention:

1. An integrated electronic module, comprising:

a plurality of terminals;

a boundary scan test logic which includes a command register, a command register decoder, and a test interface leading out of the module, the test interface including a test data input terminal for entry of command signals to the boundary scan test logic, the command register decoder for decoding command signals entered via the test data input terminal and for recognizing error control commands so as to apply corresponding error control signals to an error control output; and at least one hardware error infeed to simulate hardware errors for testing purposes, the hardware error infeed having a signal input to which the error control output is connected.

2. An integrated electronic module, comprising:

a plurality of terminals;

a pluraity of hardware error infeeds to simulate hardware errors for testing purposes; and a boundary scan test logic which includes a command register, a command register decoder, an error address register, and a test interface leading out of the module, the test interface including a test data input terminal for entry of command signals to the boundary scan test logic, the command register decoder for decoding command signals entered via the test data input terminal and for recognizing initiating error control commands so as to load the error address register with an error address, the error address register for selecting error infeeds from the plurality of hardware error infeeds on the basis of the error address in consideration of the error control command, and so as to apply corresponding error control signals to signal inputs of the error infeeds selected.

3. A method for simulating hardware errors on an integrated electronic module equipped with at least one hardware error infeed for testing purposes and a boundary scan test logic having a test interface leading out of the module, the method comprising the steps of:

transmitting command signals to the boundary scan test logic via a test data input terminal of the test interface;

decoding the command signals in a command register decoder of the boundary scan test logic;

recognizing error control commands from the decoding; and applying error control signals, from the command register decoder, to the at least one hardware error infeed based on the recognized error control commands.

4. A method for simulating hardware errors on an integrated electronic module equipped with a plurality of hardware error infeeds for testing purposes and a boundary scan test logic having a test interface leading out of the module, the method comprising the steps of:

transmitting command signals to the boundary scan test logic via a test data input terminal of the test interface;

decoding the command signals in a command register decoder of the boundary scan test logic;

recognizing an initiating error control command from the decoding;

loading an error address register with an error address in response to the error control command;

selecting and controlling error infeeds from the plurality of hardware error infeeds based on the error address in consideration of the error control command; and applying error control signals to the selected error infeeds.

* * * * *